United States Patent
Yang et al.

(10) Patent No.: US 11,802,349 B2
(45) Date of Patent: Oct. 31, 2023

(54) METHOD FOR DEPOSITING HIGH QUALITY PVD FILMS

(71) Applicant: Applied Materials, Inc., Santa Clara, CA (US)

(72) Inventors: Zihao Yang, Santa Clara, CA (US); Mingwei Zhu, San Jose, CA (US); Nag B. Patibandla, Pleasanton, CA (US); Yong Cao, San Jose, CA (US); Shumao Zhang, San Jose, CA (US); Zhebo Chen, San Jose, CA (US); Jean Lu, Palo Alto, CA (US); Daniel Lee Diehl, Chiba (JP); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/016,614

(22) Filed: Sep. 10, 2020

(65) Prior Publication Data
US 2021/0123156 A1    Apr. 29, 2021

Related U.S. Application Data

(60) Provisional application No. 62/926,362, filed on Oct. 25, 2019.

(51) Int. Cl.
*C23C 14/58* (2006.01)
*C23C 14/34* (2006.01)
(Continued)

(52) U.S. Cl.
CPC ........ *C30B 23/002* (2013.01); *C23C 14/0641* (2013.01); *C23C 14/34* (2013.01);
(Continued)

(58) Field of Classification Search
CPC ................................. C23C 14/34; C23C 14/54
See application file for complete search history.

(56) References Cited

U.S. PATENT DOCUMENTS

| 5,382,340 | A | * | 1/1995 | Kola | ...................... C23C 14/54 204/298.03 |
| 5,976,993 | A | | 11/1999 | Ravi et al. | |

(Continued)

FOREIGN PATENT DOCUMENTS

| EP | 3153603 A1 | 4/2017 |
| EP | 3232463 A1 | 10/2017 |

(Continued)

OTHER PUBLICATIONS

International Search Report and Written Opinion dated Nov. 30, 2020 for Application No. PCT/US2020/050048.

(Continued)

*Primary Examiner* — John J Brayton
(74) *Attorney, Agent, or Firm* — Patterson + Sheridan, LLP

(57) ABSTRACT

Embodiments described herein include a method for depositing a material layer on a substrate while controlling a bow of the substrate and a surface roughness of the material layer. A bias applied to the substrate while the material layer is deposited is adjusted to control the bow of the substrate. A bombardment process is performed on the material layer to improve the surface roughness of the material layer. The bias and bombardment process improve a uniformity of the material layer and reduce an occurrence of the material layer cracking due to the bow of the substrate.

11 Claims, 3 Drawing Sheets

(51) Int. Cl.
- *C23C 14/54* (2006.01)
- *C23C 14/06* (2006.01)
- *C30B 23/00* (2006.01)
- *C30B 29/40* (2006.01)
- *C30B 33/04* (2006.01)

(52) U.S. Cl.
CPC .......... *C23C 14/54* (2013.01); *C23C 14/5833* (2013.01); *C30B 29/403* (2013.01); *C30B 33/04* (2013.01)

(56) References Cited

U.S. PATENT DOCUMENTS

| | | | |
|---|---|---|---|
| 6,517,688 | B2 | 2/2003 | Sakurai et al. |
| 7,294,205 | B1 | 11/2007 | Ravi et al. |
| 10,601,388 | B2 * | 3/2020 | Burgess .............. C23C 14/0036 |
| 2002/0040848 | A1 | 4/2002 | Sakurai et al. |
| 2002/0182546 | A1 * | 12/2002 | Konishi ................. G11B 7/261 430/321 |
| 2008/0020591 | A1 | 1/2008 | Balseanu et al. |
| 2009/0242392 | A1 | 10/2009 | Laptev et al. |
| 2017/0104465 | A1 | 4/2017 | Burgess et al. |
| 2018/0354804 | A1 | 12/2018 | Venkatasubramanian et al. |
| 2018/0358222 | A1 | 12/2018 | Venkatasubramanian et al. |
| 2018/0358229 | A1 | 12/2018 | Koshizawa et al. |
| 2019/0057862 | A1 | 2/2019 | Yang et al. |
| 2019/0071767 | A1 | 3/2019 | Nakano et al. |
| 2020/0105531 | A1 * | 4/2020 | Liu .................... C23C 14/0617 |

FOREIGN PATENT DOCUMENTS

| | | | |
|---|---|---|---|
| JP | 2000273633 | A * | 10/2000 |
| JP | 2000273633 | A | 10/2000 |
| TW | 200822225 | A | 5/2008 |
| TW | 201802863 | A | 1/2018 |
| TW | 201809328 | A | 3/2018 |

OTHER PUBLICATIONS

Taiwan Office Action dated Aug. 12, 2021 for Application No. 109133089.

Taiwan Office Action dated May 12, 2021 for Application No. 109133089.

Taiwan Office Action dated Mar. 18, 2022 for Application No. 109133089, 8 pages.

* cited by examiner

METHOD FOR DEPOSITING HIGH QUALITY PVD FILMS

CROSS-REFERENCE TO RELATED APPLICATIONS

This application claims benefit of U.S. Provisional Patent Application No. 62/926,362, filed Oct. 25, 2019, which is herein incorporated by reference.

BACKGROUND

Field

Embodiments of the present disclosure generally relate to methods for processing a substrate, and more specifically, methods to deposit a film on a substrate with reduced substrate bow and improved film quality.

Description of the Related Art

Aluminum nitride (AlN) films are frequently deposited on substrates using physical vapor deposition (PVD). In certain applications, high crystal quality is desired for the AlN films. To achieve a high quality film, a thickness of the AlN film is often relatively large. For example, a thickness of the AlN film is often between about 300 nm and about 2 micrometers. However, other problems arise when a film of that thickness is used. For example, a thick AlN film causes the substrate to bow resulting in cracking of the film. The bow of the substrate may also impact subsequent processing of the substrate. For example, the bow of the substrate may result in non-uniform light distribution during a lithography process.

Thus, an improved technique to deposit film is needed.

SUMMARY

In one embodiment, a method for depositing material on a substrate is provided. The method includes depositing a material layer on a substrate. The method also includes adjusting a bias applied to the substrate while the depositing the material layer, the bias controlling a bow of the substrate. The method also includes performing a bombardment process on the material layer.

In another embodiment, a method for depositing material on a substrate is provided. The method sequentially includes adjusting a bias applied to a substrate while depositing a material layer on the substrate, the bias between about 30 W and about 80 W, and performing a bombardment process on the material layer.

In another embodiment, a method for processing a substrate is provided. The method includes depositing a material layer on a substrate disposed in a process chamber. The method also includes adjusting a bias applied to the substrate during the depositing the material layer. The method also includes generating an argon plasma and bombarding the material layer with the argon plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein include a method for depositing a material layer on a substrate while controlling a bow of the substrate and a surface roughness of the material layer. A bias applied to the substrate while the material layer is deposited is adjusted to control the bow of the substrate. A bombardment process is performed on the material layer to improve the surface roughness of the material layer. The bombardment process and bias improve surface roughness of the material layer and reduce an occurrence of the material layer cracking due to the bow of the substrate, respectively.

In one embodiment, the material layer may be deposited using physical vapor deposition (PVD). During a deposition operation, the substrate is disposed on a substrate support pedestal. In one embodiment, the substrate support pedestal is an electrostatic chuck. A first electrode is disposed in the substrate support pedestal and provides a chucking force to the substrate. A second electrode is disposed in the pedestal and provides a bias to a surface of the substrate opposite the pedestal. The bias applied to the substrate at least partially controls a bow of the substrate resulting from the deposition operation.

Figure 1:
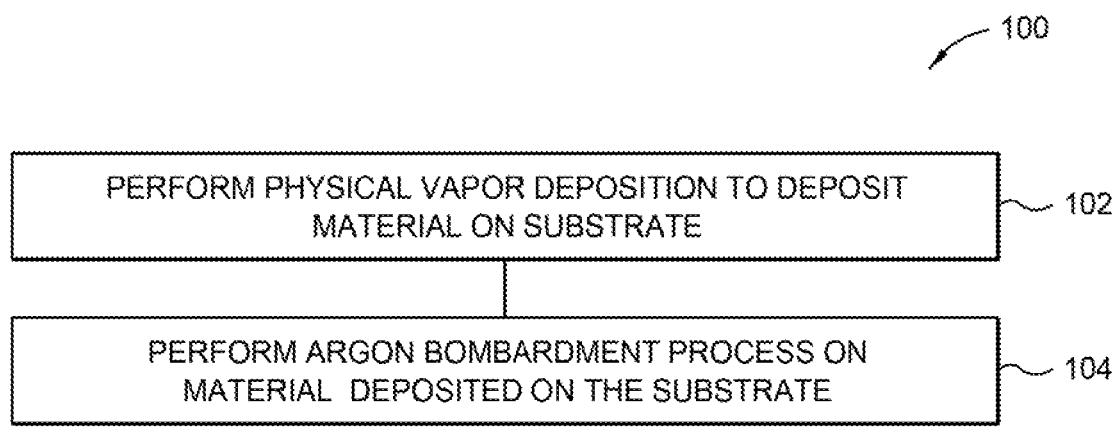
FIG. 1 illustrates operations of a method for depositing a film on a substrate, according to some embodiments.

FIG. 1 illustrates operations of a method 100 for depositing a film on a substrate, according to some embodiments. At operation 102, a physical vapor deposition (PVD) process is performed to deposit material on the substrate. The PVD process includes sputtering material from a sputter target and depositing the sputtered material onto the substrate. In one embodiment, the material deposited on the substrate is an aluminum nitride (AlN) layer.

In some embodiments, which can be combined with one or more embodiments discussed above, the material deposited on the substrate includes a scandium containing material. In some embodiments, which can be combined with one or more embodiments discussed above, the material layer includes scandium at a concentration of between about 1 atomic percent and about 25 atomic percent. For example, the material layer may include scandium at a concentration of between about 1 atomic percent and about 10 atomic percent, or between about 10 atomic percent and about 25 atomic percent.

A thickness of the material layer deposited on the substrate is between about 200 nanometers and about 2,500 nanometers, for example about 1 micrometer. In some embodiments, which can be combined with one or more embodiments described above, the PVD process is divided into more than one deposition operation. For example, the deposition operation may be repeated between about 4 times and about 30 times, for example between about 5 times and about 10 times, such as about 8 times. That is, the material layer may be a stack of multiple, smaller layers which ultimately form the material layer.

A duration of the PVD process may depend on a number of deposition operations. For example, a material layer with a thickness of about 1.5 micrometers may be deposited by between about 20 deposition operations and about 50 operations, such as about 30 deposition operations. Each of the deposition operations may have a duration of between about 30 seconds and about 80 seconds, for example between about 45 seconds and about 60 seconds, such as about 57 seconds. A power of the PVD process is between about 5 kW and about 8.5 kW, for example about 8 kW.

As another example, a material layer with a thickness of about 200 nanometers may be deposited by between about 5 deposition operations and about 10 deposition operations, such as about 8 deposition operations. Each of the deposition operations may have a duration of between about 10 seconds and about 60 seconds, for example between about 15 seconds and about 30 seconds, such as about 25 seconds. Any particular deposition operation may have a longer or shorter duration than a previous or subsequent deposition operation. A thickness of the material deposited during each deposition operation may be different. For example, five deposition operation may deposit 5 nm of material while eight subsequent deposition operation may deposit 20 nm of material.

While the material is deposited on the substrate, the substrate may bow (e.g., curve). To reduce an amount of bow of the substrate, a bias is applied to the substrate during the deposition process. The bias may be applied to the substrate during each deposition operation. In one embodiment, which can be combined with one or more embodiments discussed above, a single bias (e.g., 50 W) is applied to the substrate during each deposition operation. The same bias (e.g., 50 W) may be applied to the substrate during each of the deposition operations.

In some embodiments, which can be combined with one or more embodiments described above, a first bias value may be applied to the substrate during a first number of deposition operations and a second bias value may be applied to the substrate during a second number of depositions operations. For example, a first bias of about 40 W is applied during a first 10 deposition operations and a second bias of 60 W is applied during a subsequent 12 deposition operations.

In some embodiments, which can be combined with one or more embodiments described above, a bias applied to the substrate may be determined based on a bow of the substrate resulting from a previous deposition operation. For example, a first bias applied to the substrate during a first deposition operation may cause the substrate to bow. The bow of the substrate is measured after the first deposition operation. A bias applied to the substrate during a subsequent deposition operation may be determined based on the measured substrate bow such that the bias applied during the subsequent operation counteracts the measured substrate bow. That is, following the subsequent deposition operation, the bow of the substrate is negligible.

For example, a bias that creates a concave substrate bow (e.g., 40 W) may be applied to the substrate following a deposition operation that created convex substrate bow (e.g., 60 W). That is, the bias applied to the substrate may reduce a bow of the substrate by applying a bow that is opposite the bow resulting from a previous deposition operation. The bias applied to the substrate during the deposition operations may be alternated between a bias resulting in a convex substrate bow and a bias resulting in a concave substrate bow. Thus, the bow of the substrate with the material layer deposited thereon is substantially reduced.

In some embodiments, which can be combined with one or more embodiments described above, a bow of the substrate is known before the material layer is deposited thereon. In that case, the bias to achieve a suitable substrate bow may be determined based on the preexisting bow of the substrate. For example, a bias that causes a convex substrate bow may be applied to a substrate with a concave bow such that the resulting bow of the substrate after the material layer is deposited thereon is substantially neutral.

In some embodiments, which can be combined with one or more embodiments discussed above, the bias applied during each deposition operation may be different from a bias applied during a preceding deposition operation. For example, the bias during a first deposition operation may be about 0 W. The bias may be increased for each subsequent deposition operation such that the bias during a last deposition operation is about 100 W.

In some embodiments, which can be combined with one or more embodiments described above, the bias may be adjusted based on a thickness of the material deposited on the substrate. For example, the bias may be increased as the thickness of the deposited material increases. As the thickness of the deposited material increases, the larger bias may achieve a suitable substrate bow profile.

In some embodiments, which can be combined with one or more embodiments described above, the bias may be adjusted for each deposition operation based on a linear function. In other embodiments, which can be combined with one or more embodiments described above, the bias may be adjusted for each deposition operation based on a step function.

An average bias applied to the substrate during operation 102 is between about 30 W and about 100 W, such as between about 50 W and about 75 W. The bias applied to the substrate may be a continuous bias or a pulsed bias. During processing of the substrate, the bias applied to the substrate is adjusted automatically by a controller.

Advantageously, adjusting the bias applied to the substrate controls a bow of the substrate. Adjusting the bias changes the substrate bow from a tensile type bowing to a compressive type bowing. That is, a substantially neutral bow profile is achieved for a substrate with a material layer disposed thereon. By controlling the bow of the substrate, an occurrence of damage to the material layer (e.g., cracking) is reduced. The bow of the substrate may also impact subsequent processing of the substrate. For example, the bow of the substrate may result in non-uniform light distribution during a lithography process. Further, adjusting or tuning the substrate bias does not reduce a quality (e.g., a crystallinity) of the material layer.

A pressure used during the PVD process may be between about 1.5 mTorr and about 6.5 mTorr, for example between about 2 mTorr and about 3.5 mTorr, such as about 2.5 mTorr. The pressure may be adjusted to improve a surface roughness of the material layer.

At operation 104, an argon bombardment process is performed on the material layer deposited on the substrate. The argon bombardment process includes generating an argon plasma in a process chamber. The bombardment process is performed for between about 50 seconds and about 250 seconds, for example between about 100 seconds and about 200 seconds, such as about 150 seconds.

Advantageously, the bombardment process further improves a surface roughness of the deposited material layer without affecting the substrate bow or crystallinity (i.e., quality) of the material layer. A surface roughness of the material layer after the bombardment process is between about 1.10 nanometers and about 0.85 nanometers, for example about 0.99 nanometers.

In one embodiment, which can be combined with one or more embodiments described above, the method 100 may be repeated. For example, the operation 102 may be performed to deposit material on the substrate for between about 10 seconds and 30 seconds, for example between about 22 seconds and 28 seconds, such as about 25 seconds. The bombardment process of operation 104 may then be performed for between about 15 seconds and about 45 seconds, for example between about 20 seconds and 40 seconds, such as about 30 seconds. In this embodiment, the method 100 may be repeated between about 5 times and about 10 times, such as about 8 times, such that a total deposition time of operation 102 is between about 50 seconds and about 300 seconds, such as about 200 seconds and a total bombardment time of operation 104 is between about 75 seconds and about 450 seconds, such as about 240 seconds.

Figure 2A:
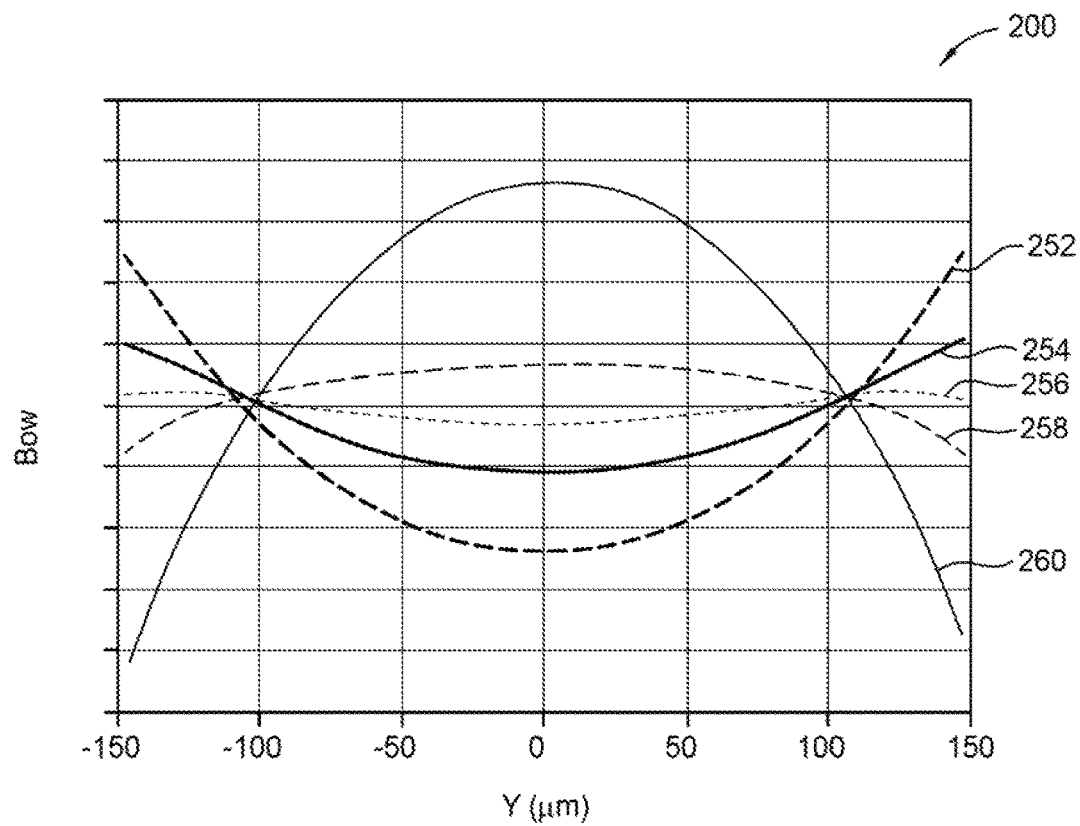
FIG. 2A is a graph illustrating data representative of substrate bow after a material layer is deposited thereon, according to some embodiments.

FIG. 2A is a graph 200 illustrating data representative of substrate bow after a material layer is deposited thereon, according to some embodiments. The material layer is deposited on the substrates by a deposition process, such as the deposition process discussed with respect to FIG. 1. A power of a deposition process corresponding to FIG. 2A is about 8 kW.

A thickness of the material layer deposited on the substrates corresponding to the substrate bows depicted in the graph 200 is about 500 nm. The vertical axis of the graph 200 corresponds to substrate bow and the horizontal axis is a location on the substrate from a center point (Y=0 mm) of the substrate. No post processing is performed on the material layers discussed with respect to FIG. 2A.

A first line 252 on the graph 200 depicts a bow of a substrate with a material layer deposited thereon. A bias was not applied to the substrate corresponding to the first line 252 during processing. As depicted by the first line 252, the substrate has a convex bow, where an outer portion of the substrate (near the outer edge at about Y=±150 mm) is bowed in a direction toward a surface of the substrate with the material layer deposited thereon and the center portion of the substrate (near the center of the substrate at about Y=0 mm) is bowed away from the surface with the material layer deposited thereon. As an example, a total resulting bow of the substrate corresponding to the first line 252 is between about 120 micrometers and about 180 micrometers, such as about 140 micrometers.

A second line 254 on the graph 200 depicts a bow of a substrate with a material layer deposited thereon. A bias applied to the substrate corresponding to the second line 254 during processing was higher than the bias applied to the substrate corresponding to the first line 252. For example, a bias applied to the substrate corresponding to the second line 254 is between about 10 W and about 45 W, such as about 40 W.

As depicted by the second line 254, the corresponding substrate has a convex bow, where an outer portion of the substrate (near Y=±150 mm) is bowed toward the material layer deposited thereon and the center portion of the substrate (near Y=0 mm) is bowed away from the material layer. The bow of the substrate corresponding to the second line 254 is less than the bow of the substrate corresponding to the first line 252. A total bow of the substrate corresponding to the second line 254 is between about 90 micrometers and about 120 micrometers, such as about 105 micrometers. That is, the bow of the substrate corresponding to the second line 254 is reduced by about 25 percent compared to the bow of the substrate corresponding to the first line 252.

A third line 256 on the graph 200 depicts a bow of a substrate with a material layer deposited thereon. A bias applied to the substrate corresponding to the third line 256 during processing is higher than the bias applied to the substrate corresponding to the second line 254. For example, the bias applied to the substrate corresponding to the third line 256 is between about 30 W and about 55 W, such as about 50 W.

As depicted by the third line 256, the corresponding substrate has a convex bow (bowed away from the material layer) near the center of the substrate (Y=0 mm) and a concave bow (bowed toward the material layer) near the outer edge of the substrate (Y=±150 mm). The bow of the substrate corresponding to the third line 256 is less than (i.e., reduced) the bow of the substrate corresponding to the second line 254. For example, the bow of the substrate corresponding to the third line 256 is between about 10 micrometers and about 50 micrometers, such as about 20 micrometers. That is, the bow of the substrate corresponding to the third line 256 is reduced by about 80 percent compared to the bow of the substrate corresponding to the second line 254.

A fourth line 258 on the graph 200 depicts a bow of a substrate with a material layer deposited thereon. A bias applied to the substrate corresponding to the fourth line 258 during processing is higher than the bias applied to the substrate corresponding to the third line 256. For example, the bias applied to the substrate corresponding to the fourth line 258 is between about 50 W and about 80 W, such as about 60 W.

As depicted by the fourth line 258, the corresponding substrate has a concave bow, where a center portion of the substrate (near the center of the substrate at Y=0 mm) is bowed toward the material layer and an outer portion of the substrate (near the outer edge of the substrate at Y=±150 mm) is bowed away from the material layer. The bow of the substrate corresponding to the fourth line 258 is greater than the bow of the substrate corresponding to the third line 256. However, the bow of the substrate corresponding to the fourth line 258 is less than the bow of the substrates corresponding to the first line 252 and the second line 254.

The bias applied to the substrate corresponding to the fourth line 258 caused an increase in the bow of the substrate compared to the bow of the substrate corresponding to the third line 256. For example, the bow of the substrate corresponding to the fourth line 258 is between about 50 micrometers and about 150 micrometers, such as about 75 micrometers. Thus, the bow of the substrate corresponding to the fourth line 258 produces a substrate bow that is increased by about 30 percent compared to the substrate corresponding to the third line 256. A fifth line 260 on the graph 200 depicts a bow of a substrate with a material layer deposited thereon. A bias applied to the substrate corresponding to the fifth line 260 during processing is higher than the bias applied to the substrate corresponding to the fourth line 258. For example, the bias applied to the substrate corresponding to the fifth line 260 is between about 65 W and about 120 W, such as about 100 W.

As depicted by the fifth line 260, the corresponding substrate has a concave bow, where the a center portion of the substrate (near the center of the substrate at Y=0 mm) is bowed toward the material layer and an outer portion of the substrate (near the outer edge of the substrate at Y=±150 mm) is bowed away from the material layer. The bow of the substrate corresponding to the fifth line is greater than the bow of the substrates corresponding to the first line 252, the second line 254, the third line 256, and the fourth line 258. A maximum bow for the substrate corresponding to the fifth line 260 is about 375 micrometers.

While the first line 252 and second line 254 are illustrated having a convex bow, these lines could have a concave bow depending various parameters, such as the bias applied to the substrate or which surface of the substrate the material layer is deposited on. Similarly, the bow of the substrates corresponding to the third line 256, the fourth line 258, and the fifth line 260 could be opposite of the bow depicted in the graph 200 and described above.

As illustrated by the graph 200, adjusting the bias applied to the substrate during deposition of the material layer controls a bow of the substrate. For example, as the bias is increased, the bow of the substrate is reduced up to a certain point after which the bow of the substrate increases. Based on the graph 200 above, the bias at which the bow of the substrate is minimized is between about 40 W and about 60 W applied to the substrate during deposition of the material layer. The bias at which the bow of the substrate is minimized may be changed due to various parameters such as a thickness of the material layer deposited on the substrate during processing, a thickness of a material layer existing on the substrate prior to the biased deposition operation, etc.

Figure 2B:
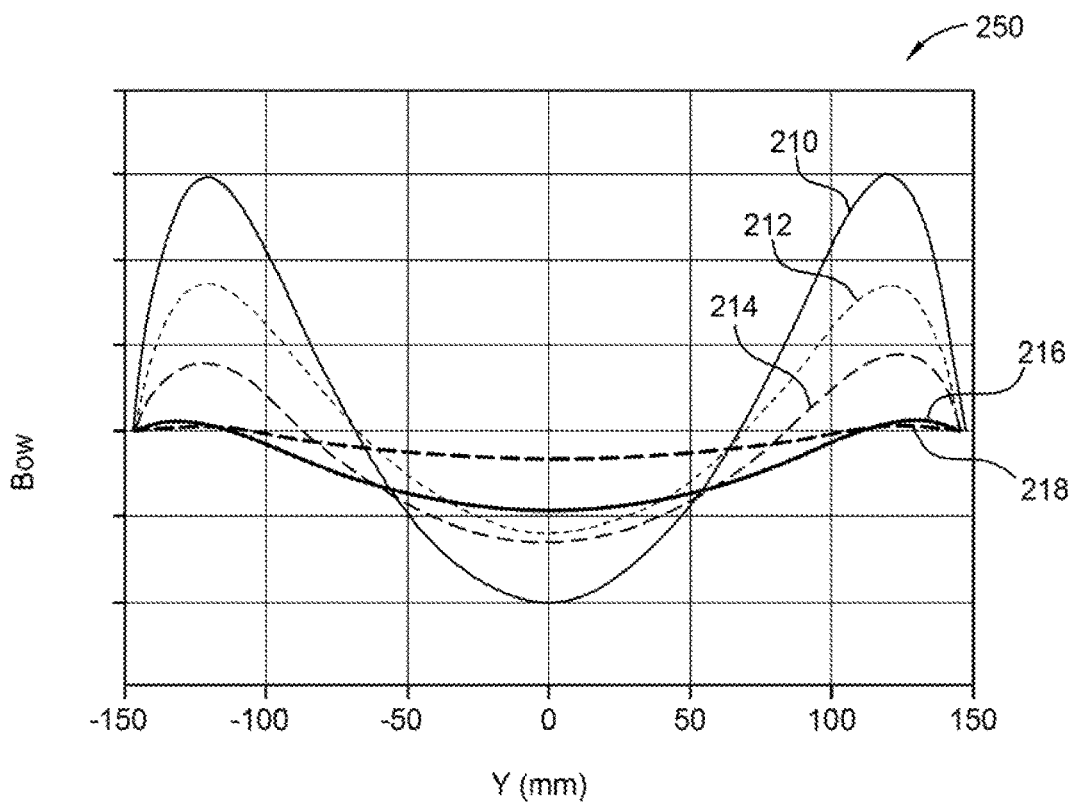
FIG. 2B is a graph illustrating data representative of substrate bow after a material layer is deposited thereon, according to some embodiments.

FIG. 2B is a graph 250 illustrating data representative of a minimum substrate bow after a material layer of a particular thickness is deposited thereon, according to some embodiments. The graph includes one or more lines 210-218 each corresponding to a substrate having a different thickness of a material layer deposited thereon. A thickness of the material layer decreases from a first line 210 to a fifth line 218, as discussed below. A pressure of the deposition process to deposit the material layer is between about 4 mTorr and about 6 mTorr, such as about 5.2 mTorr. The vertical axis of the graph 250 corresponds to substrate bow in micrometers and the horizontal axis corresponds to a location on the substrate from an outer edge (Y=±150 mm) to a center point (Y=0 mm) of the substrate. No post processing is performed on the material layers discussed with respect to FIG. 2B.

The first line 210 depicts a bow of a substrate having a material layer with a thickness of about 2500 nm deposited thereon. A bias applied to the substrate during deposition of the material layer was between about 70 W and about 80 W, such as about 75 W. As depicted by the first line 210, the substrate has a convex bow near the center (Y=0 mm) and a concave bow near the edge, at about Y=±125 mm.

A second line 212 depicts a bow of a substrate having a material layer with a thickness of about 1500 nm deposited thereon. A bias applied to the substrate during deposition of the material layer was between about 65 W and about 75 W, such as about 70 W. As depicted by the second line 212, the corresponding substrate has a convex bow near the center (Y=0 mm) and a concave bow near the edge, at about Y=±125 mm. The bow of the substrate corresponding to the second line 212 is reduced by about 50 percent compared to the substrate corresponding to the first line 210.

A third line 214 depicts a bow of a substrate having a material layer with a thickness of about 1000 nm deposited thereon. A bias applied to the substrate during deposition of the material layer was between about 60 W and about 70 W, such as about 65 W. As depicted by the third line 214, the corresponding substrate has a convex bow near the center (Y=0 mm) and a concave bow near the edge, at about Y=±125 mm. The bow of the substrate corresponding to the third line 214 is reduced by about 25 percent compared to the substrate corresponding to the second line 212.

A fourth line 216 depicts a bow of a substrate having a material layer with a thickness of about 400 nm deposited thereon. A bias applied to the substrate during deposition of the material layer was between about 50 W and about 60 W, such as about 55 W. As depicted by the fourth line 216, the corresponding substrate has a convex bow near the center (Y=0 mm) and a concave bow near the edge, at about Y=±125 mm. The bow of the substrate corresponding to the fourth line 216 is reduced by about 50 percent compared to the substrate corresponding to the third line 214.

The fifth line 218 depicts a bow of a substrate having a material layer with a thickness of about 200 nm deposited thereon. An average bias applied to the substrate during deposition of the material layer was between about 45 W and about 55 W, such as about 50 W. As depicted by the fifth line 218, the corresponding substrate has a convex bow near the center (Y=0 mm) and a concave bow near the edge, at about Y=±125 mm. The bow of the substrate corresponding to the fifth line 218 is reduced by about 70 percent compared to the substrate corresponding to the fourth line 216.

A combination of the thicknesses of the material layers and the biases discussed above demonstrate that the bias applied to a substrate during deposition of a material layer thereon can be used to tune a bow of the substrate. As illustrated in FIG. 2B, the bias applied to the substrate during deposition of the material layer can be used to influence or tune the bow of the substrate depending on a thickness of the material layer deposited thereon. For a material layer having a thickness of less than 2500 nm, the bow of the substrate in any direction can be maintained to be less than about 100 micrometers.

Figure 3:
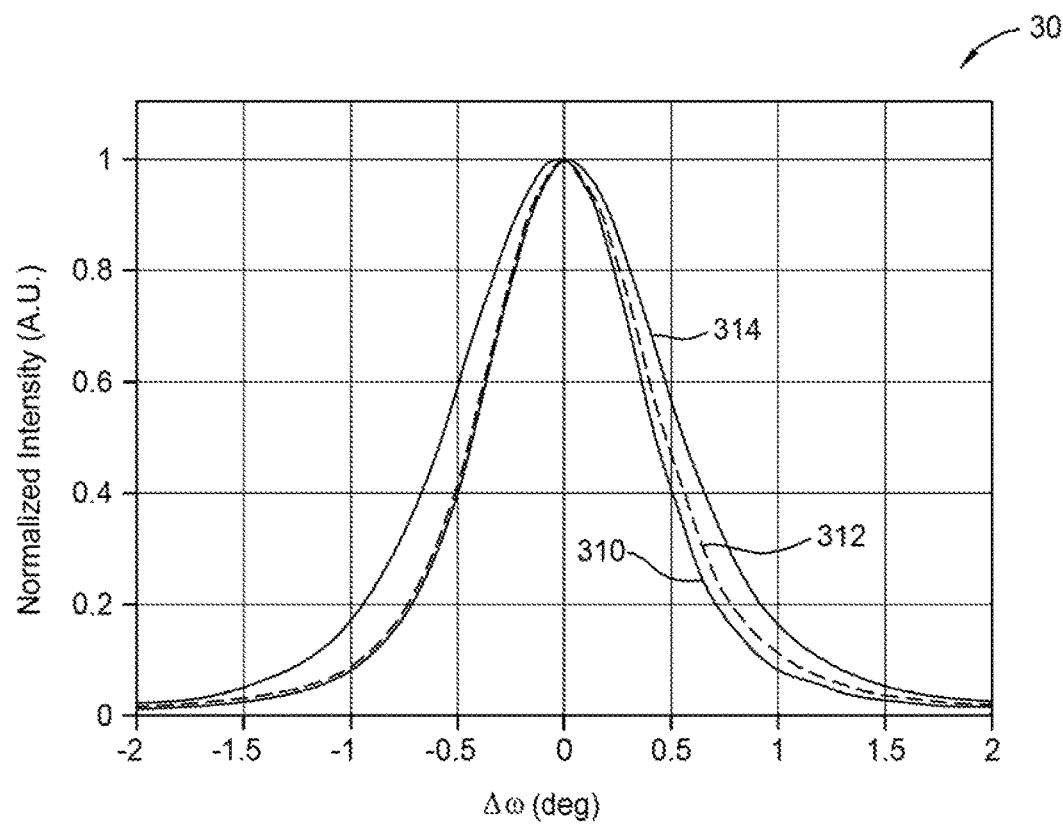
FIG. 3 is a graph illustrating data representative of a measured quality of a material layer after being deposited on a substrate, according to some embodiments.

FIG. 3 is a graph 300 illustrating data representative of a measured quality of a material layer after being deposited on a substrate, according to some embodiments. The quality of the material layer is measured using an x-ray diffraction rocking curve scan along an AlN (002) crystal direction. The material layer is deposited on the substrate by a deposition process, such as the deposition process discussed with respect to FIGS. 1, 2A, and 2B above. A pressure of the deposition process used to deposit the material layer on the substrate was between about 4 mTorr and about 6 mTorr, such as about 5.2 mTorr. A thickness of the material layer is about 2500 micrometers.

A first line 310, second line 312, and a third line 314 indicate a quality of the material layer at a center point, about 70 mm from the center point, and near an edge of the substrate, respectively. A full-width-half maximum (FWHM) of the AlN (002) rocking curve of less than 1 degree indicates sufficient crystallinity (structure) of the material layer. The XRD rocking curve has been normalized to 1 and therefore the half-maximum is about 0.5. A full-width half maximum for the first line 310 and the second line 312 is less than 1 degree while the FWHM for the third line 314 is about 1 degree. The FWHMs for the first line 310, the second line 312, and the third line 314 illustrate that crystallinity of the material layer is consistent and uniform from a center point (corresponding to the first line 310) to an outer edge of the substrate (corresponding to the third line 314). Thus, the deposition process discussed above improves bow of the substrate with the material layer deposited thereon while maintaining sufficient crystallinity and uniformity of the crystal quality within the material layer.

Figure 4:
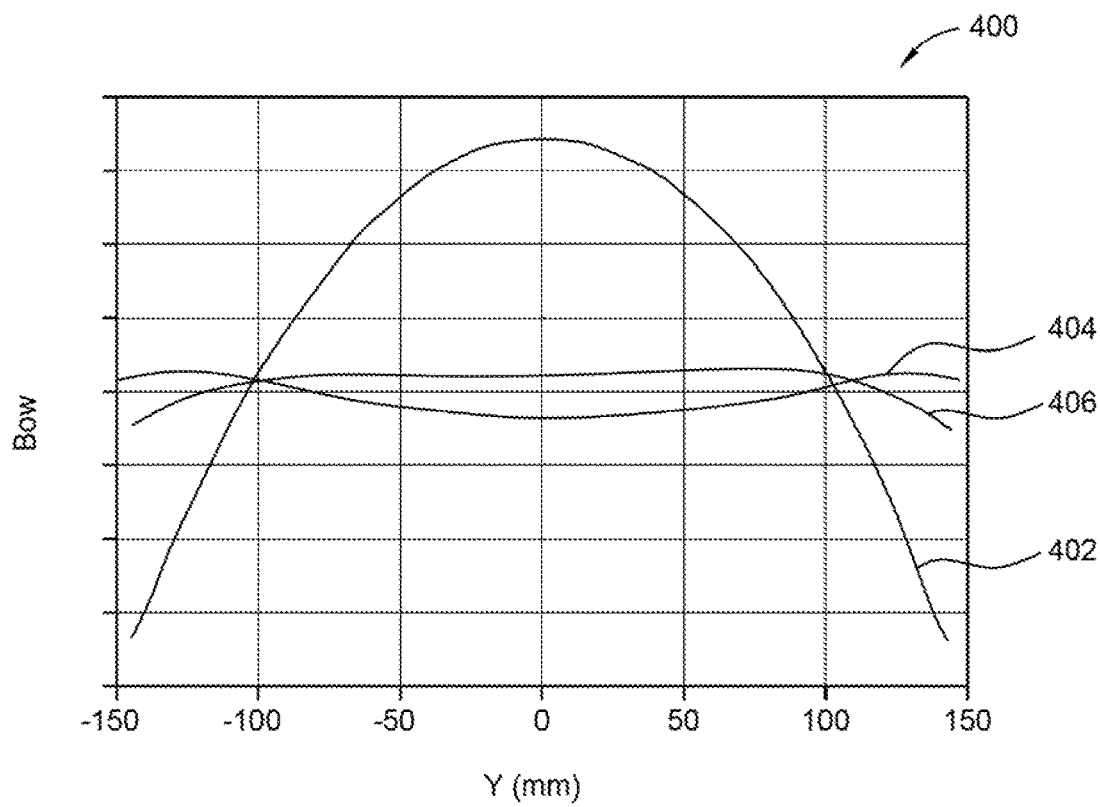
FIG. 4 is a graph illustrating data representative of substrate bow after being deposited on a substrate, according to some embodiments.

FIG. 4 is a graph 400 illustrating data representative of substrate bow after a material layer is deposited thereon, according to some embodiments. The material layer is deposited on the substrates by a deposition process, such as the deposition process discussed with respect to FIGS. 1, 2A, and 2B above. The substrate bows depicted in the graph 400 represent a bow of the substrates with a 200 nm thick material deposited thereon. The vertical axis of the graph 400 represents substrate bow and the horizontal axis is a location on the substrate from a center point (Y=0 mm) of the substrate.

A first line 404 on the graph 400 depicts a bow of a substrate with a material layer deposited thereon. A pressure of the PVD process to deposit the material layer was about between about 2 mTorr and about 6 mTorr, such as 5.2 mTorr. The deposition process is repeated about eight times to reach the material layer thickness of 200 nm. That is, a thickness of the material layer deposited by each of the eight operations is about 25 nm. No post deposition process, such as bombardment, has been performed on the material layer. As depicted by the first line 404, the corresponding substrate has a total bow magnitude of about 10 micrometers from either outer edge (Y=±150 mm) to the center (Y=0 mm). A surface roughness of the material layer deposited on the substrate depicted by the first line 404 is about 1.24 nm.

A second line 402 on the graph 400 depicts a bow of a substrate with a material layer disposed thereon. The material layer was deposited on the substrate in intervals to reach a thickness of about 200 nm. The deposition operation was repeated between about 6 times and about 12 times, such as about 8 times. That is, a thickness of the material layer deposited on the substrate by each deposition operation is between about 16 nm and about 33 nm, such as about 25 nm. A bombardment process, such as the bombardment process discussed with respect to FIG. 1 above, was performed after each 20 nm material layer was deposited. As depicted by the second line 402, the corresponding substrate has a total bow magnitude of about 135 micrometers from either outer edge (Y=±150 mm) to the center (Y=0 mm). A surface roughness of the material layer deposited on the substrate depicted by the second line 402 is about 0.86 nm. A pressure of the PVD process used to deposit the material layer is between about 2 mTorr and about 6 mTorr, such as 2.5 mTorr.

A third line 406 on the graph 400 depicts a bow of a substrate with a material layer disposed thereon. The material layer was deposited on the substrate in intervals to reach a thickness of about 200 nm. The deposition operation was repeated between about 6 times and about 12 times, such as about 8 times. A pressure of the PVD process used to deposit the material layer is between about 2 mTorr and about 6 mTorr, such as 2.5 mTorr. A bombardment process, such as the bombardment process discussed with respect to FIG. 1 above, was performed after the 200 nm material layer was deposited. As depicted by the third line 406, the corresponding substrate has a total bow magnitude of about 13 micrometers from either outer edge (Y=±150 mm) to the center (Y=0 mm). A surface roughness of the material layer deposited on the substrate depicted by the third line 406 is about 0.97 nm.

As discussed above, the surface roughness of the material layer deposited on the substrates corresponding to the second line 402 and the third line 406 after the bombardment process is smoother than the material layer deposited on the substrate corresponding to the first line 404 without the bombardment process. Although the bombardment process performed on the substrate corresponding to the second line 402 provides a slightly smoother surface roughness compared to the substrate corresponding to the third line 406 with the bombardment process performed thereon, the bow of the substrate corresponding to the third line 406 is significantly better than the bow of the substrate corresponding to the second line 402. That is, a bombardment operation after each of deposition interval of the material layer on the substrate corresponding to the second line 402 results in significantly increased substrate bow compared to a single bombardment operation after deposition of the material layer corresponding to the third line 406. Therefore, a single bombardment operation after deposition of the material layer is used to achieve both low substrate bow and a smooth surface roughness.

While the foregoing is directed to embodiments of the present disclosure, other and further embodiments of the disclosure may be devised without departing from the basic scope thereof, and the scope thereof is determined by the claims that follow.

What is claimed is:

1. A method for depositing a compound nitride material on a substrate, the method comprising:
   depositing a first portion of a material layer on a substrate;
   applying a first bias while depositing the first portion of the material layer, the first bias controlling a bow of the substrate;
   halting deposition after depositing the first portion of the material layer;
   obtaining a measured substrate bow after depositing the first portion of the material layer;
   depositing a second portion of the material layer on the substrate; and
   applying a second bias in response to the measured substrate bow while depositing the second portion of the material layer, the second bias different than the first bias.

2. The method of claim 1, further comprising performing an argon bombardment process on the material layer, wherein the argon bombardment process comprises generating an argon plasma localized on a surface of the substrate and exposing the material layer to the argon plasma to reduce a surface roughness of the material layer, and wherein a power of the argon bombardment process is between about 250 W and about 1000 W and a duration of the argon bombardment process is between about 10 seconds and about 400 seconds.

3. The method of claim 2, wherein a power used for the depositing the material layer is between about 4 kW and about 10 kW.

4. The method of claim 1, wherein a thickness of the material layer is between about 100 nanometers and about 2500 nanometers.

5. The method of claim 1, wherein the material layer comprises aluminum nitride.

6. The method of claim 5, wherein the material layer further comprises scandium in a concentration between about 1 atomic percent and about 10 atomic percent.

7. The method of claim 5, wherein the material layer further comprises scandium in a concentration between about 10 atomic percent and about 25 atomic percent.

8. The method of claim 1, further comprising performing an argon bombardment process on the material layer.

9. The method of claim 1, wherein a chamber pressure during the first portion of the material layer is between about 2 mTorr and about 6 mTorr.

10. The method of claim 1, wherein the first bias applied to the substrate is between about 40 watts and about 100 watts.

11. The method of claim 1, wherein the first bias is less than the second bias.

* * * * *